United States Patent
Iwasaki et al.

(10) Patent No.: US 6,691,566 B2
(45) Date of Patent: Feb. 17, 2004

(54) METHOD OF MAKING FINITE ELEMENT TIRE MODEL

(75) Inventors: Naoaki Iwasaki, Kobe (JP); Kimihiro Hayashi, Tokyo (JP); Sturt Richard, London (GB)

(73) Assignees: Sumitomo Rubber Industries, Ltd., Tokyo (JP); The Japan Research Institute, Limited, Tokyo (JP)

( * ) Notice: Subject to any disclaimer, the term of this patent is extended or adjusted under 35 U.S.C. 154(b) by 217 days.

(21) Appl. No.: 09/946,536

(22) Filed: Sep. 6, 2001

(65) Prior Publication Data

US 2002/0050317 A1 May 2, 2002

(30) Foreign Application Priority Data

Sep. 6, 2000 (JP) ......................................... 2000-270495

(51) Int. Cl.⁷ ............................................. G01M 17/02
(52) U.S. Cl. ........................................................ 73/146
(58) Field of Search ......... 73/146, 8; 152/209.1–209.9, 152/526–538, 554, 117

(56) References Cited

U.S. PATENT DOCUMENTS 5,593,523 A * 1/1997 Suzuki et al. ................ 152/527
6,564,625 B1 * 5/2003 Ishiyama ....................... 73/146

FOREIGN PATENT DOCUMENTS

EP 0 919 941 A2 6/1999

OTHER PUBLICATIONS

Helnwein et al., Finite Elements in Analysis and Design, vol. 14 (1993) pp. 1–16., (no month).

* cited by examiner

Primary Examiner—William Oen
(74) Attorney, Agent, or Firm—Birch, Stewart, Kolasch & Birch, LLP

(57) ABSTRACT

A method of making a finite element model of a pneumatic tire comprises: dividing a pneumatic tire into a plurality of modeling units each of which is to be modeled by one or more finite elements so that the modeling units include modeling units each of which is a layered complex of at least one cord layer and at least one rubber layer; and modeling each modeling unit which is a layered complex by a single shell element provided with a plurality of integral points corresponding to the cord and rubber layer.

8 Claims, 11 Drawing Sheets

METHOD OF MAKING FINITE ELEMENT TIRE MODEL

The present invention relates to a method of making a finite element model of a pneumatic tire used in a finite element method to analyze tire performance, tire behavior and the like and suitably used to simulate a system including pneumatic tires.

In recent years, as the computers' performances have been remarkably improved, finite element methods are used in the field of pneumatic tires, and not only static analyses of a tire but also dynamic analyses of a tire and simulation are becoming possible. As a result, it becomes possible to estimate various tire performances accurately without making actual tires.

In the laid-open Japanese patent application JP-A-11-153520 (corresponding to U.S. Pat. No. 6,199, 026), a finite element tire mode is disclosed, wherein, as shown in FIG. 12, a cord layer (b) is modeled by a quadrangular membrane element (d) and a rubber layer (c) is modeled by a hexahedral solid element (e). In case of the FIG. 12 example, the number of the elements is five and the number of nodes of the superposed elements is twenty four. Thus, the computation load is not so light.

On the other hand, it is strongly required to simulate and analyze a system including a vehicle body, tires and roads in order to reduce the research and development time and cost for the tires and improve overall tire performance including a vehicle body.

In case of the above-mentioned finite element tire model, the total element number and total node number of a set of tires are still large, and those of the system becomes very large. Therefore, the computation time becomes very long, and at the worst the computation becomes impossible due to the memory size limit.

It is therefore, an object of the present invention to provide a method of making a finite element model of a pneumatic tire, in which the number of finite elements can be decreased and speedup of computation time is possible without sacrificing accuracy of analyses and simulation.

According to the present invention, a method of making a finite element model of a pneumatic tire comprises dividing a pneumatic tire into a plurality of modeling units each of which is to be modeled by one or more finite elements so that the modeling units include modeling units each of which is a layered complex of at least one cord layer and at least one rubber layer, and modeling each of the modeling unit which is a layered complex, by a shell element provided with a plurality of integral points corresponding to the at least one cord layer and at least one rubber layer.

A shell element itself has no thickness when viewed from the coordinates of its nodes, but it may have data relating to the thickness of the objective layer(s) in addition to other data relating to the physical properties, e.g. Young's modulus, Poisson's ratio, specific gravity and the like. Contrary, a membrane element is an element such that forces to be considered are only those in its plane, namely, it delivers only tension, compression and shearing force along the plane. Thus, it has no data relating to forces outside its plane and accordingly bending stress, bending stiffness and the like can not be handled. Therefore, it may be said that a major difference between a shell element and a membrane element is that the shell element has a bending stiffness but the membrane element dose not have its bending stiffness.

Embodiments of the present invention will now be described in detail in conjunction with the accompanying drawings.

Tire Structure

Figure 1:
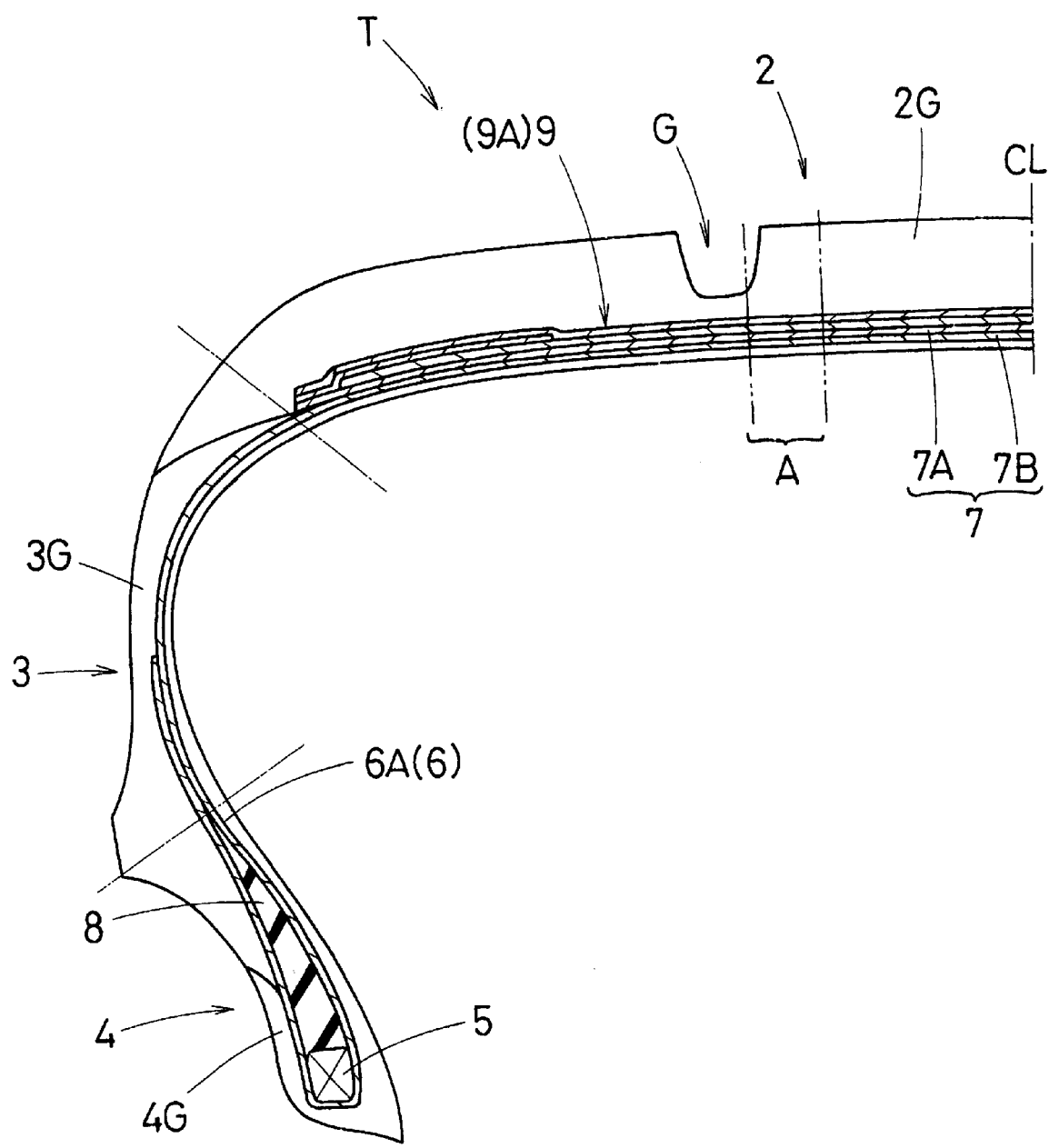
FIG. 1 is a cross sectional view of a pneumatic tire showing a typical structure.

First, a typical structure of a pneumatic tire T is illustrated according to FIG. 1.

The tire T is composed of a tread portion 2, a pair of axially spaced bead portions 3 and a pair of sidewall portions 3, and it has a toroidal shape. Here, each "portion" means neither a surface of the tire nor a rubber component. It means a tire part between the outer surface and inner surface of the tire. Thus, it includes one or more rubber components 11 and one or more reinforcing cord layers 10.

In the FIG. 1 example, a carcass 6 and a belt (7, 9) are such reinforcing cord layers 10. Incidentally, a pull-resistant bead core 5 is disposed in each bead portion 3.

The carcass 6 comprises at least one ply 6A of cords extending between the bead portions 3 through the tread portion 2 and sidewall portions 3 and turned up around the bead cores 5 to be secured thereto.

The belt is disposed radially outside the carcass 6 in the tread portion 2, and it comprises a breaker 7 and an optional band 9 disposed on the radially outside of the breaker 7. The breaker 7 usually comprises two cross plies 7A and 7B each made of parallel cords inclined in one direction. The band 9 usually comprises a ply 9A of cords oriented in the circumferential direction of the tire.

As to the rubber components 11, on the other hand, a tread rubber 2G is disposed in the tread portion 2 as a relatively thick rubber component on the radially outside of the belt. The radially outer surface of the tread rubber 2G is usually provided with tread grooves G defining a tread pattern.

In each of the sidewall portions 3 likewise, a sidewall rubber 3G is disposed axially outside the carcass 6.

In each of the bead portions 4, a bead rubber 4G is disposed on the axially outside of the carcass 6. Further, a bead apex 8 made of radially outwardly tapering hard rubber is provided between a carcass ply turnup portion and carcass ply main portion, so as to extend from the radially outside of the bead core 5 in the bead portion 4 into a lower sidewall portion.

Further, an inner liner, a gas-impermeable rubber layer is disposed along the inner surface of the tire.

Thus, the tread portion 2 and sidewall portion 3 can be regarded as a layered complex F of alternate one or more cord layers 10 and adjacent rubber layers 11.

To be concrete, in the tread portion 2, the cord layers 10 include the band cord ply 9A, the breaker cord plies 7A, 7B, and the carcass cord ply 6A. The rubber layers 11 include the tread rubber 2G, the inner liner rubber and layers between the reinforcing cord layers 10 including topping rubber (tg) and the like.

In the sidewall portion 3, the cord layers 10 include the carcass cord ply 6A which forms two layers of the turnup portion and main portion in the lower sidewall portion, but one layer of the main portion in the upper sidewall portion. The rubber layers 11 include the sidewall rubber 3G, the inner liner rubber and layers between the reinforcing cord layers 10 including topping rubber (tg) and the like, and the bead apex rubber 8 in the lower sidewall portion.

As to the bead portions 4, on the other hand, these portions are fixed between rigid rim flanges of a wheel rim on which the tire to be simulated is mounted. Therefore, usually it is not necessary to consider the bead portions 4 in simulating their elastic deformation.

In case of a radial tire for passenger cars, for example, the carcass 6 is composed of a ply of organic fiber cords such as polyester arranged at substantially 90 degrees with respect the tire equator, and the breaker 7 is composed of two cross plies 7A and 7B of steel cords laid at +20 and −20 degrees with respect the tire equator (plus/minus sign means clockwise/counterclockwise), and the band 9 is made of spirally wound organic fiber cords double in the edge portions and single in the central portion.

Fundamental Concept

Next, a fundamental method of modeling a small part of the tire by one or more finite elements will be descried.

Figure 2A:
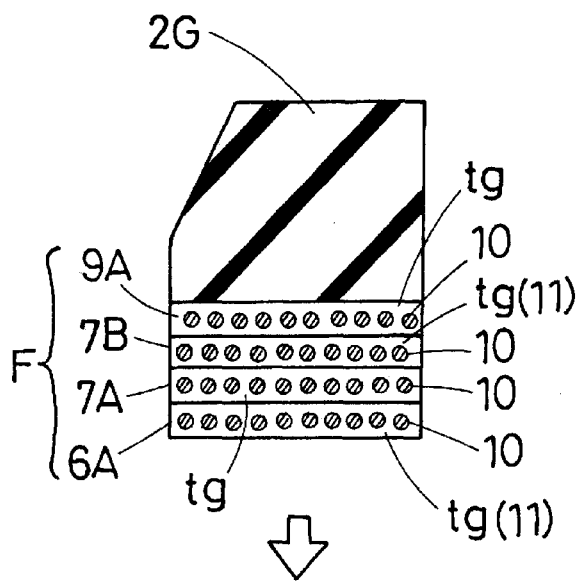
FIG. 2A is an enlarged cross sectional view of a part (A) in FIG. 1.

FIG. 2A shows a small part of the tire corresponding to a region (A) of FIG. 1. In this small part, four cord layers 10 exist—one carcass ply 6A, two breaker plies 7A and 7B, and one band ply 9A. On the other hand, as the outmost rubber layer, a combination of the thick tread rubber 2G and the thin topping rubber of the outmost cord layer exists. As the radially inner most cord layer, a combination of the inner liner rubber and the topping rubber for the innermost cord layer exists. And three layers of topping rubber exist between the four cord layers 10.

Figure 2B:
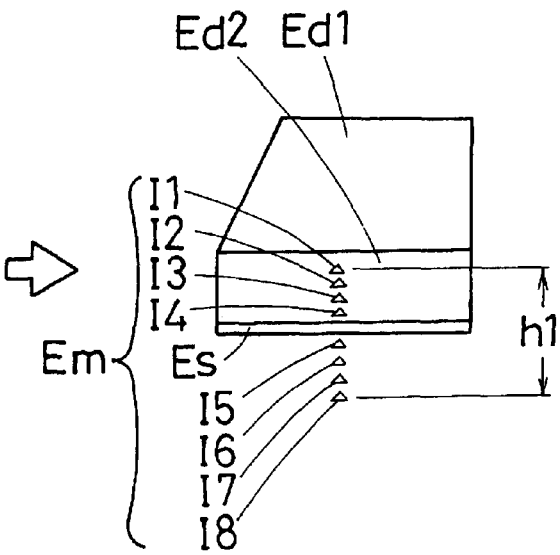
FIG. 2B is a finite element model of the part (A) modeled according to the present invention.
Figure 2C:
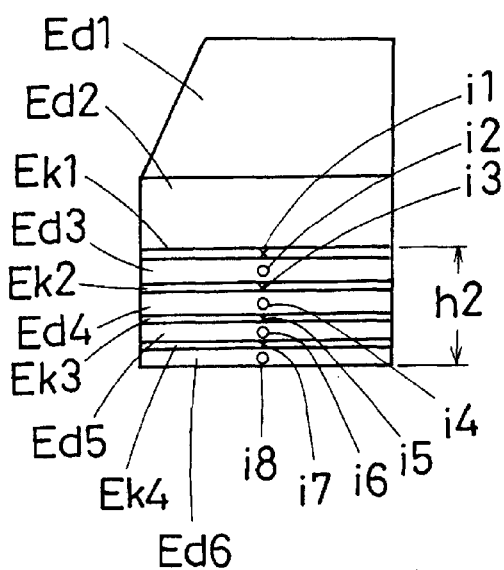
FIG. 2C is a finite element model of the part (A) modeled according to the prior art.
Figure 3A:
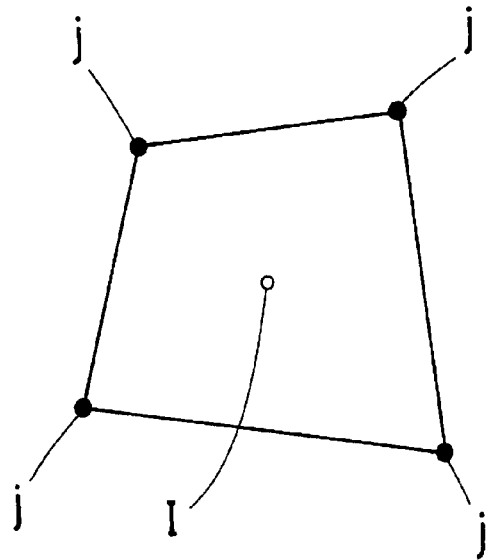
FIGS. 3A and 3B show membrane elements.
Figure 3B:
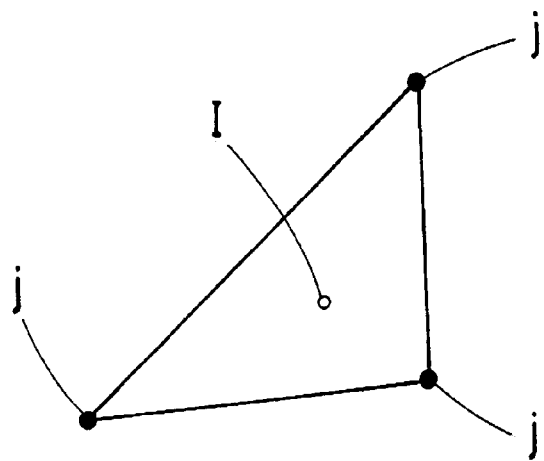
Figure 4A:
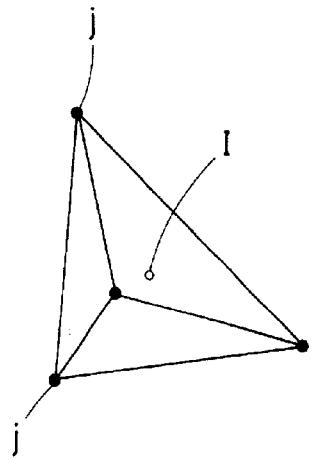
FIGS. 4A, 4B and 4C show solid elements.
Figure 4B:
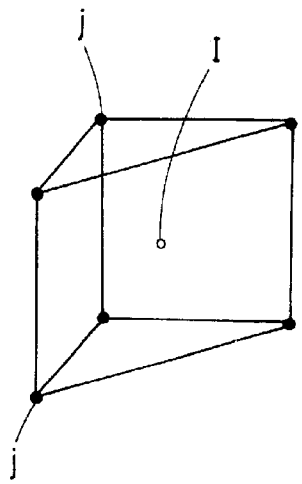
Figure 4C:
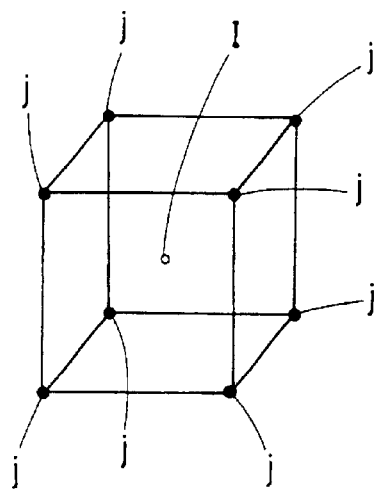

When an accurate analyses or simulation is required rather than speed, such part is preferably modeled as shown in FIG. 2C, wherein the cord layers 10 are each modeled by a membrane element Ek1–Ek4 such as quadrangular membrane element, and the outermost rubber layer is modeled by solid elements Ed1 and Ed2 such as hexahedral solid element, and the rubber layers between the cord layers and the innermost rubber layer are each modeled by a hexahedral solid element Ed3–Ed6. The hexahedral solid elements Ed3–Ed6 for the rubber layers 11 and the membrane elements Ek1–Ek4 for the cord layers 10 are each provided with a single integral point i1–i8. Further, stiffness matrixes are defined on all the integral points i1–i8 and the nodes of all the elements. Such a single integral point (i) is placed on or near the center of mass of the object. Thus, in case of a membrane element, as shown in FIGS. 3A and 3B, the integral point is placed on or near the center of area of the membrane element. In case of a solid element, as shown in FIGS. 4A, 4B and 4C, the integral point is placed on or near the center of volume of the solid element.

An integral point is not bound to the adjacent elements unlike nodes and it is utilized together with an integral point of an adjacent element to determine a stress therebetween. The stress can be obtained by multiplying a strain therebetween by the Young's modulus.

In the present invention, a speedup is required as well as accuracy. Therefore, rubber layers 11 and cords layers 10 in a small part of the tire are modeled by a special single shell element Es such as trigonal shell element, quadrangular shell element and the like which is accompanied by a plurality of integral points (I) representing the rubber layers and cord layers so as to be able to simulate the bending stiffness and elongation and contraction of the complex F.

FIG. 2B shows a finite element model of the above-mentioned small part shown in FIG. 2A. In this example, for the reason given later, the outermost rubber layer (tread rubber) is modeled by two solid elements Ed1 and Ed2 such as hexahedral solid elements of which boundary is set at the bottom of the deepest tread groove G. However, the remaining rubber layers and all the cords layers (eight layers in total) are modeled by a single shell element Es with eight integral points I1–I8.

The shell element Es is positioned at the inner end of the inner solid element Ed2 and connected thereto. In other words, the coordinates of the nodes are so defined. In FIG. 2B, the shell element Es is shown as having a small thickness but this is for convenience sake only.

The integral points (I, I1–I8) correspond to the cord layers and rubber layers. To be concrete, the integral points I1, I3, I5 and I7 represent the positions and properties of the band ply 9A, the belt plies 7B and 7A, and the carcass ply 6A, respectively. The integral points I2, I4, I6 and I8 represent the positions and properties of three topping layers between the cord layers and one layer inside the carcass ply 6A, respectively.

In this example, the layers are each represented by a single integral point (I), and the integral point (I) is placed on or near the center of mass of the objective layer. Thus, in case of cord layer, the integral point is placed on or near the center of area of a plane extending in the thickness center of the cord layer. In case of rubber layer, the integral point is placed on or near the center of volume thereof.

Thus, the relative positions of the above-mentioned eight integral points (i1–i8) in the FIG. 2C example, namely, the spaces between them can be used for the integral points (I1–I8). But the coordinates of the above-mentioned eight integral points (i1–i8) or the absolute positions can not be used because of the position of the shell element Es which is shifted to the inner end of the solid element Ed2.

The stiffness matrixes of the cord layers and rubber layers are accordingly defined on the integral points I1–I8.

Aside from the above-explained single integral point (I) per one layer, it is also possible to provide a plurality of integral points (I) per one objective layer.

Relative Position of Shell Element

Generally, the shell element Em is formed in the thickness center of the layered complex F of the cord layers 10 and rubber layers 11.

Figure 5:
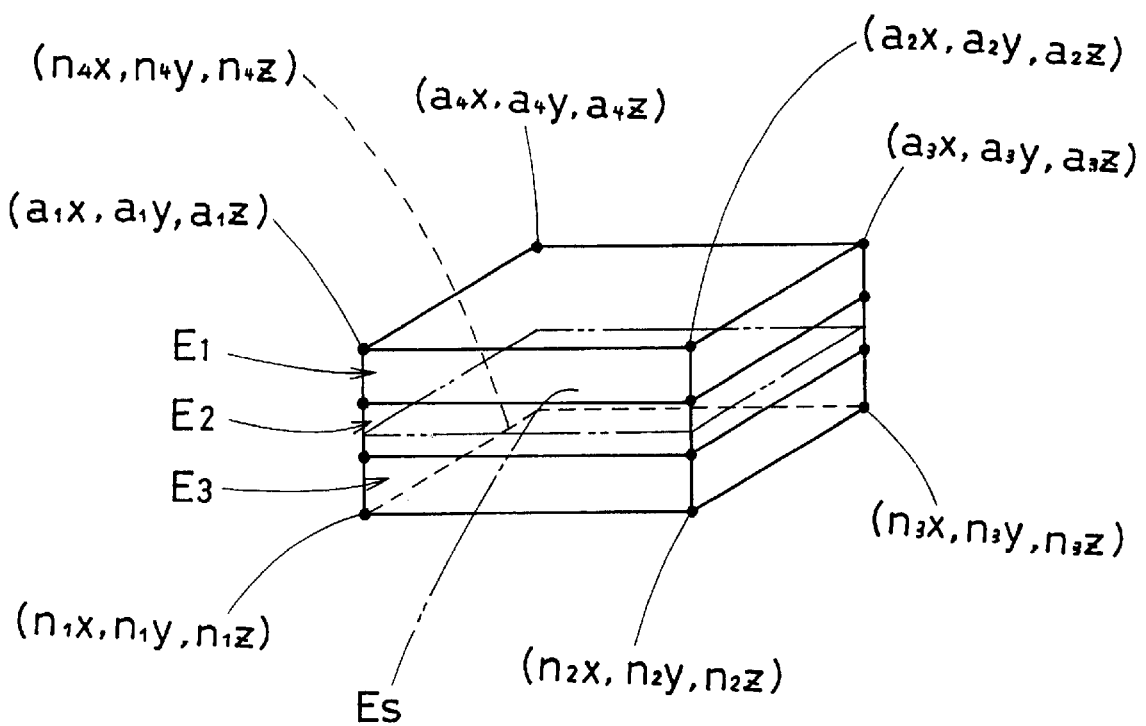
FIG. 5 is a diagram for explaining the relative position of the shell element to the superposed elements.

Therefore, if the layered complex F are once modeled by solid elements and membrane elements as in the FIG. 2C example, it may be said that the position of the shell element Es is just in the middle of the extreme elements. Concretely speaking, in case of a FIG. 5 example where solid elements E1, E2 and E3 are piled up while interposing membrane elements therebetween, XYZ coordinates of each of the four nodes of the shell element Es can be expressed as follows, using XYZ coordinates of the extreme nodes of the extreme elements E1 and E3:

First node: $\{(a1x+n1x)/2, (a1y+n1y)/2, (a1z+n1z)/2\}$

Second node: $\{(a2x+n2x)/2, (a2y+n2y)/2, (a2z+n2z)/2)\}$

Third node: $\{(a3x+n3x)/2, (a3y+n3y)/2, (a3z+n3z)/2\}$

Fourth node: $\{(a4x+n4x)/2, (a4y+n4y)/2, (a4z+n4z)/2\}$

It is of course possible to determine the relative position of the shell element Es to the complex F directly without converting to solid elements and membrane elements.

In the FIG. 2B example, as the shell element Es is shifted to the inner end of the solid element Ed2, the integral points (I1–I8) are shifted accordingly, maintaining their relative positions to the shell element Es.

Finite Element Dividing

Generally, the tread rubber 2G is provided with tread grooves G as mentioned-above. Accordingly, properties of the tread rubber vary along the circumferential direction. However, the properties of other rubber components such as the sidewall rubber 3G, bead rubber 4G, inner liner rubber and the like are substantially constant in the circumferential direction and their variations are negligible.

Therefore, it is desirable for accuracy that the tread rubber 2G is modeled separately from the shell element Es as explained above by the solid elements Ed, e.g. hexahedral solid element, pentahedral solid element, tetrahedral solid element and the like.

In the sidewall portions 3 and bead portions 4, on the contrary, the entire thickness including the sidewall rubber 3G, bead rubber 4G and the like may be modeled by a single shell element Es with a plurality of integral points (I).

Such finite element dividing also h as an advantage such that when (a) the tread groove arrangement or tread pattern is changed (simulation of combination with another tread pattern), (b) the tread pattern is not changed but the tread rubber thickness is decreased (simulation of tread wear), a finite element tire model can be easily made by modeling the tread rubber only without remaking the shell elements.

Modeling (1)

According to the present invention, a finite element tire model can be made by dividing the tire into a large number of parts, and modeling each part by (a) a shell element Es and at least one solid element Ed or (b) a single shell element Es only.

As explained above, the design (a) may be applied to a part that is cut out from the tread portion 2 including the entire thickness. The design (b) may be applied to such a part that is cut out from the sidewall portion 3 including the entire thickness. However, the designs (a) and (b) are not always limited to these two applications.

Figure 6:
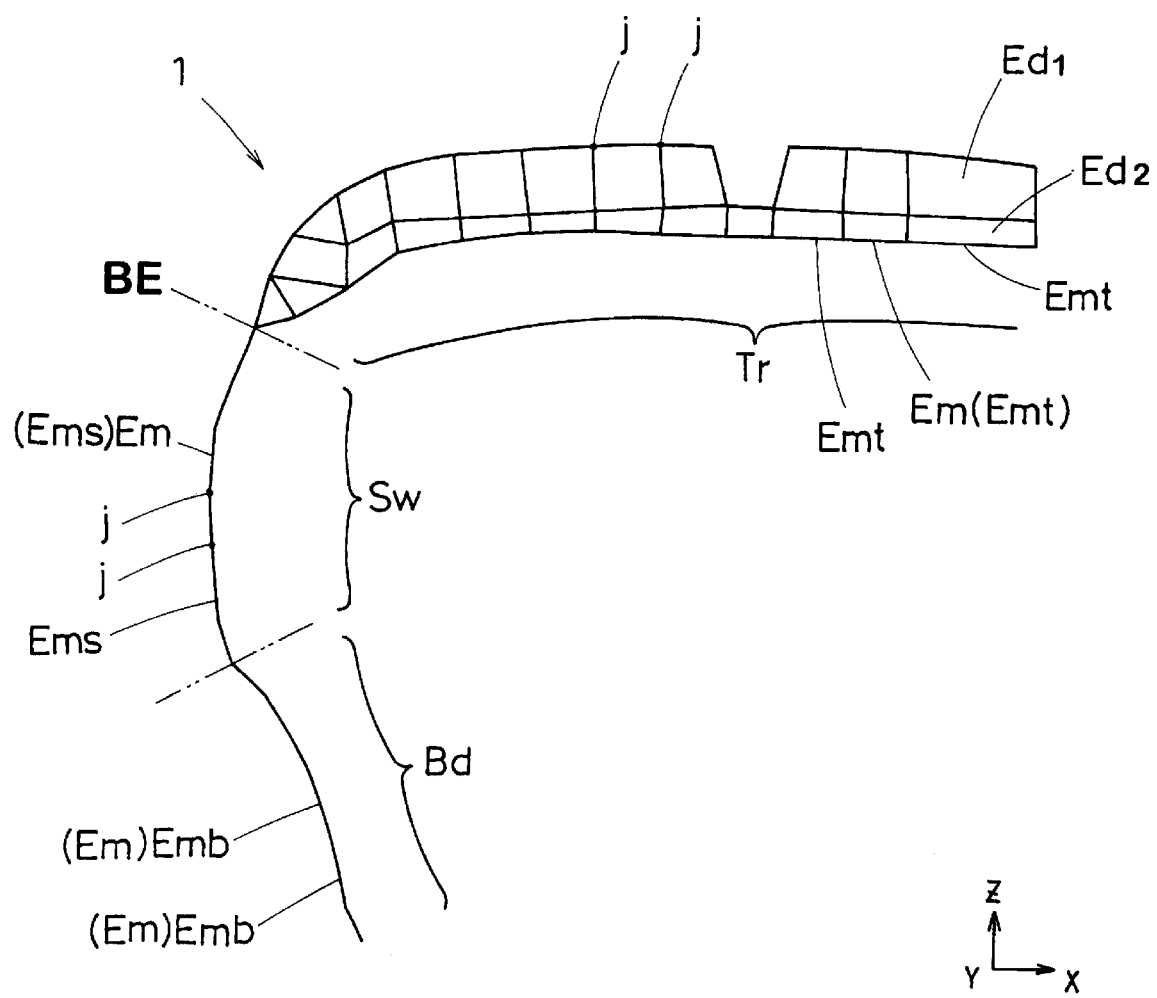
FIG. 6 shows finite element meshes of a tire model according to the present invention.

An example of the finite element tire model is shown in FIG. 6.

The number of finite elements and the number of the nodes are greatly decreased. This is apparent when FIG. 2B and FIG. 2C are compared with each other. In FIG. 2B, the number of the nodes of the quadrangular shell element Es is only four. But, in FIG. 2C, the number of nodes of the four quadrangular membrane elements Ek1–Ek4 and the four hexahedral solid elements Ed3–Ed6 reaches twenty. Accordingly, the computation time for the determination of the nodes' positions, contingence decision between the elements and the like can be greatly decreased. Therefore, the finite element tire model can be suitably utilized to simulate a rolling tire to evaluate various dynamic tire performances by applying equations of motion, boundary conditions, load vectors and the like.

Decreasing of Integral Points

In order to further speed up the computation time, the inventors were studied how the number of the integral points (I) can be decreased, and discovered a method to decrease the integral points (I) for example eight points (I1–I8) to two integral points IF1 and IF2.

Figure 7:
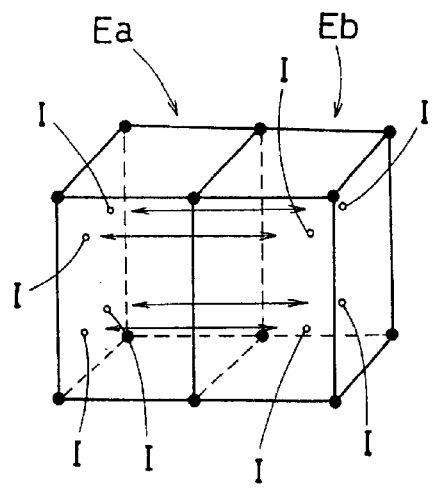
FIG. 7 shows solid elements having four integral points.

For example, in case of a hexahedral solid element, by defining four integral points (I) as shown in FIG. 7, the share, compression and tension between the adjacent elements may be completely simulated. However, if two integral points (I) are defined per one element, a better simulation of the share, compression and tension between the adjacent elements is possible. It is also true of the shell element Es. Thus, the number of the integral points (I) is decreased to two. The two integral points need to be disposed one on each side of the shell element Es.

Figure 8A:
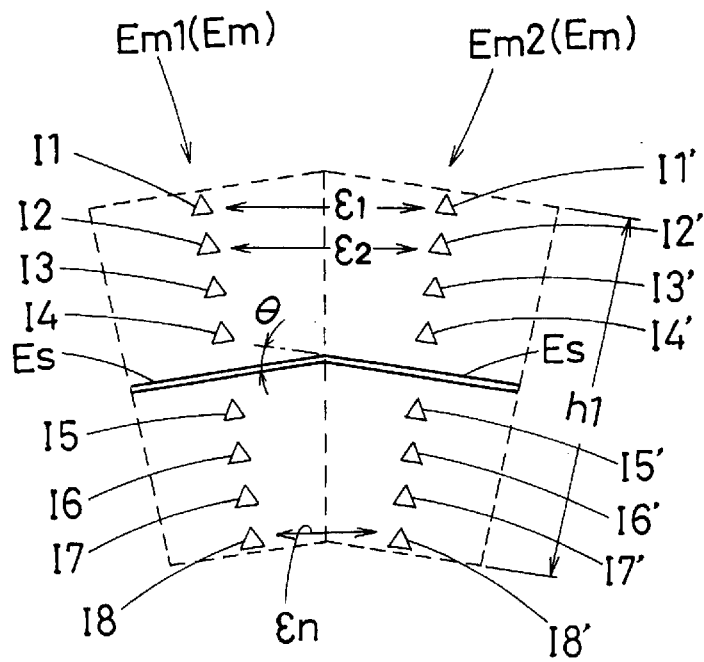
FIGS. 8A and 8B are diagrams for explaining a method of decreasing the integral points.
Figure 8A:
Figure 8B:
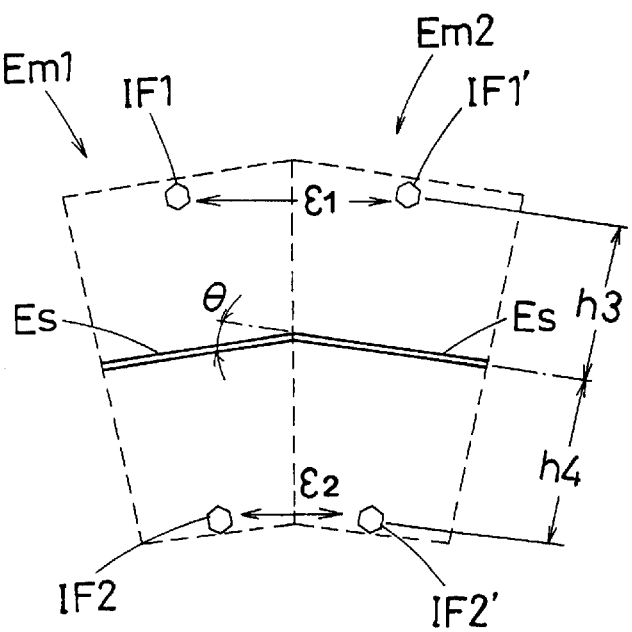

Next, according to FIGS. 8A and 8B, this method will be explained. FIG. 8A shows the above-mentioned example shell element Es with eight integral points I1–I8. FIG. 8B shows a shell element with two representative integral points IF1 and IF2. In case of FIG. 8A, the stiffness matrixes are defined on the integral points I1–I8 as explained above.

In case of FIG. 8B, the position of the shell element Es may be the same as that in FIG. 8A, and a stiffness matrix is defined on the integral point IF1 on the upper side of the shell element Es, which matrix is obtained by adding or superposing the stiffness matrixes defined on the original integral points I1, I2, I3 and I4 on the upper side of the shell element Es. Likewise, a stiffness matrix is defined on the integral point IF2 on the lower side of the shell element Es, which is obtained by adding or superposing the original stiffness matrixes defined on the integral points I5, I6, I7 and I8 on the lower side of the shell element Es. Incidentally, the stiffness matrixes to be added should be linear matrixes so that they can be added into one.

It is preferable that when adding the stiffness matrixes of the cord and rubber layers, the stiffness matrixes of the cord layers are weighted according to the thicknesses of the cord layers.

The positions h3 and h4 of the integral points IF1 and IF2 are determined so that the total stress $\sigma B$ on the integral points IF1 and IF2 becomes the same as the total stress $\sigma A$ on the integral points (I1–I8). The total stresses $\sigma A$ and $\sigma B$, for example when two adjacent shell elements Es are bent at an angle $\theta$, are as follows:

$$\sigma A = \sum_{K=1}^{n} (E_K \times |\varepsilon_K|) \quad (n = \text{number of integral points})$$

$$\sigma B = E_1 \times |\varepsilon_1| + E_2 \times |\varepsilon_2|$$

wherein $\varepsilon$ is the strain between the corresponding integral points, and E is the Young's modulus.

Therefore, h3 and h4 are set to satisfy the condition $\sigma A = \sigma B$.

As the number of the integral points is decreased, the computation time for the stress is greatly decreased. But, due to the superposed stiffness matrix and the provision of one integral point on each side of the shell element Es, the substantially same accurate analysis results can be obtained with respect the expansion and contraction of the shell element Es therealong and bending stress, bending deformation, bending rigidity and the like.

Modeling (2)

Therefore, the above-mentioned method of making a finite element tire model may include a process of decreasing the integral points (I) in number to two integral points IF1 and IF2 per one shell element Es.

Rigidity Anisotropy

On the other hand, when making the shell element Es, the cord angle of the cord layer 10 must be taken into consideration.

If in a complex F there are a plurality of cord layers each having a stiffness anisotropy such that the tensile elastic modulus is high in the cord oriented direction but low in the orthogonal direction, then it is preferable that the stiffness anisotropys are converted into one and given to the shell element Es in view of speedup of computation time.

The following is an example of the converting method. First, a stress-strain matrix (hereinafter the "D matrix") of each cord layer is defined according to the stiffness anisotropy thereof, supposing the objective cord layer to be a shell element (hereinafter the "intermediate shell element"). Then, the D matrixes are superposed into one. Giving that D matrixes $D_1'$, $D_2'$ and $D_3'$ are of intermediate shell elements 1, 2 and 3 whose cord angles θ1, θ2 and θ3 with respect the circumferential direction of the tire are for example +20, −20 and +20 degrees, respectively (plus/minus sign means clockwise and counterclockwise or the reverse), an equivalent D matrix $D_{eq'}$ which is given to the shell element Es is $$D_{eq}'=(t_1 \times D_1 + t_2 \times D_2 + t_3 \times D_3)/(t_1+t_2+t_3)$$

wherein $D_1$, $D_2$ and $D_3$ are D matrixes which are obtained by rotating the intermediate shell elements 1, 2, 3 such that the cord angle becomes zero, and $t_1$, $t_2$ and $t_3$ are the thicknesses of the shell elements 1, 2 and 3 or the objective cord layers.

Incidentally, the rotated D matrix $D_1$, $D_2$ or $D_3$ can be obtained by using a rotation matrix $T_\theta$ (θ is rotation angle) and a transposed matrix $T^T_\theta$ of the rotation matrix $T_\theta$ as follows:

$$D_1 = T^T_{-\theta 1} \times D_1' \times T_{-\theta 1} = T^T_{-20deg} \times D_1' \times T_{-20deg}$$

$$D_2 = T^T_{-\theta 2} \times D_2' \times T_{-\theta 2} = T^T_{+20deg} \times D_2 \times T_{+20deg}$$

$$D_3 = T^T_{-\theta 3} \times D_3' \times T_{-\theta 3} = T^T_{-20deg} \times D_3 \times T_{-20deg}$$

Further, from the inverse matrix $D_{eq}^{-1}$ of the equivalent D matrix $D_{eq}'$ the Young's modulus E and transverse elastic modulus G of the equivalent superposed shell element can be obtained as follows:

$$D_{eq}^{-1} = \begin{bmatrix} \frac{1}{E_a} & -\frac{v_{vb}}{E_a} & -\frac{v_{ca}}{E_a} & 0 & 0 & 0 \\ -\frac{v_{ab}}{E_a} & \frac{1}{E_b} & -\frac{v_{cb}}{E_a} & 0 & 0 & 0 \\ -\frac{v_{ac}}{E_a} & -\frac{v_{bc}}{E_a} & \frac{1}{E_c} & 0 & 0 & 0 \\ 0 & 0 & 0 & \frac{1}{G_{ab}} & 0 & 0 \\ 0 & 0 & 0 & 0 & \frac{1}{G_{bc}} & 0 \\ 0 & 0 & 0 & 0 & 0 & \frac{1}{G_{ca}} \end{bmatrix}$$

Use of Average Property

As explained above, the shell element Es in each modeling unit Em such as the above-mentioned small part in the region (A) may be said as being already provided with an average stiffness in a sense, namely, an average in the thickness direction.

In order to further lighten the processing load in making the shell elements Es for a large number of modeling units Em, a succession of shell elements Es along a direction orthogonal to the tire circumferential direction may be given matrixes of a property, e.g. stiffness and the like which is averaged in the orthogonal direction.

An example of area dividing for averaging the stiffness is shown in FIG. 7. The area dividing and the finite element dividing (meshes) are of course closely related with each other, but they are different from each other as explained below.

The finite element meshes shown in FIG. 6 is for the tire T shown in FIG. 1. In this example, the tire T is roughly divided into a tread area Tr between the belt edges BE, an upper sidewall area Sw extending from the belt edge BE to the radially outer end of the bead apex rubber 8, and a lower sidewall area Bp extending radially inwardly from the radially outer end of the bead apex rubber 8. As the bead apex rubber 8 in this example is extended to a relatively higher position above the rim flange, the radially outer end of the bead apex rubber 8 is utilized as the dividing point between the two areas Sw and Bp.

Usually, a point at which a rubber thickness greatly changes, a point at which the number of cord layers changes, a mid point of property's transition and the like are utilized as a dividing point, and a sidewall between the belt edge and a position corresponding to the rim flange's upper end is divided into two or three areas.

In the tread area Tr, the stiffness of the belt inclusive of the breaker and band is averaged in the orthogonal direction or the axial direction, and the obtained average stiffness and a stiffness matrix therefor are used for the shell element Es in every modeling unit Emt in the tread area Tr. For the reason as explained above, the radially outer most rubber layer (tread rubber 2G) in the modeling unit Emt is separately modeled by the solid elements Ed1 and Ed2. By setting the boundary between the solid elements Ed1 and Ed2 at a constant depth radially inside the deepest groove bottom for every modeling units Emt, an average property of the under tread rubber can be used for such modeling units Emt.

In the upper sidewall area Sw, each modeling unit Ems including the axially outer most rubber layer (mainly sidewall rubber 3G) is modeled by a shell element Es. And the stiffness of the carcass is averaged in the orthogonal direction or the radial direction, and the obtained average stiffness and a stiffness matrix therefor are used for the shell element Es in every modeling unit Ems in the upper sidewall area Sw.

In the lower sidewall area Bp, each modeling unit Emb including the radially outer most rubber layer (sidewall rubber 3G), the bead apex rubber and the like if any is modeled by a shell element Es. And the stiffness of the carcass with the bead apex therein is averaged in the orthogonal direction or the radial direction, and the obtained average stiffness and a stiffness matrix therefor are used for the shell element Es in every modeling unit Emb in the lower sidewall area Bp.

In FIG. 6, the finite element tire model is made up of a chain of the shell elements Es which continues from bead to bead, and the solid elements Ed1 and Ed2 thereon for the tread rubber (incl. topping rubber).

Modeling (3)

Thus, the above-mentioned method of making a finite element tire model may include the following processes:

in a certain area along a normal direction to the tire circumferential direction, averaging a property along the normal direction, and giving the average property to a succession of shell elements.

It was confirmed from comparison tests that even if the tire model is simplified as above, the difference of the load-deflection curve of the simplified model from that of the actual tire is small.

Further, such a simplified tire model has merit such that, even if the cord and rubber layers 10 and 11 are changed in number, thickness, material and the like, the tire model needs to be altered a little.

In such a simplified model, on the other hand, under some conditions for example where the cord layers such as belt plies 7A and 7B have different widths, there is a possibility that the above-mentioned inverse matrix $D_{eq}^{-1}$ converted from a D matrix $D_{eq}'$ has matrix components which are naturally zero as indicated above but actually finite values (hereinafter the "null components"). If such matrixes are used, analyses of Young's modulus and the like and the accuracy of simulation degrade.

Such bad influence may be avoided by using a D matrix $(D_{eq}')_{min}$ instead of the D matrix $D_{eq}'$ This D matrix $(D_{eq}')$ min can be obtained by rotating the D matrix $D_{eq}'$ by a small angle "min" such that the null components become minimized. For the rotation angle "min", an angle at which the sum of squares of the null components becomes minimal is preferably used. Accordingly, the D matrix $(D_{eq}')_{min}$ is obtained as follows:

$$(D_{eq}')_{min} = T^T_{min} \times D_{eq}' \times T_{min}$$

wherein $T_{min}$ is a rotation matrix of which rotation angle is "min" and $T^T_{min}$ is a transposed matrix of the rotation matrix $T_{min}$.

Usually, the angle "min" is about ten degrees at most. This was discovered as a result of examination under various conditions.

This angle "min" may be also used as a re presentative cord angle of the shell element Es.

In general, when the shell element Es is given a representative cord angle which is neither zero nor 90 degrees, a material coordination system which is set in the cord direction is utilized in order to simplify the process of computing the stresses in the shell element. As a result, when computing the stress of the entire model, the material coordination system must be converted to a coordination system which is set to the entire model.

Therefore, by omit ting such coordinate conversion, a further speedup is possible.

It was discovered that when a modeling unit Em includes all the belt plies inclusive of the breaker and band (the unit Em may be in the above-mentioned tread area Tr), the shell element Es may be provided with zero degrees as its representative cord angle, irrespective of the existence of the carcass, and that when a modeling unit Em includes the carcass but the belt (the unit Em may be in the above-mentioned sidewall area Sw ot Bd), the shell element Es may be provided with 90 degrees as its representative cord angle. Even if the representative cord angle is so defined, because of the nature of a cord reinforced pneumatic tire, the accuracy is not decreased and the computation time can be remarkably shortened.

Modeling (4)

Therefore, the above-mentioned method of making a finite element tire model may include the following processes:

examining whether a modeling unit Em meets the following conditions (a) the modeling unit Em includes the belt or (b) the modeling unit Em includes the carcass but the belt, and setting the representative cord angle of the shell element Es at zero degrees if the condition (a) is met or 90 degrees if the condition (b) is met.

Accordingly, the coordinate conversion becomes not necessary, and the computation time therefor becomes zero.

Comparison Test

The following table 1 shows vertical spring constant of a radial tire of size 205/50R16 for passenger cars obtained by a finite element method using tire models Ex.1-Ex.4 and Ref.1. The results shown in table 1 are indicated as a difference in percent from the measurements on an actual tire. Also the computation time is shown as a percentage with respect to that of Ref.1 model.

TABLE 1

| Model | Ref. 1 | Ex. 1 | Ex. 2 | Ex. 3 | Ex. 4 |
|---|---|---|---|---|---|
| Number of elements | 35000 | 10800 | 10800 | 10800 | 10800 |
| Computing time (%) | 100 | 55 | 37 | 30 | 18 |
| Vertical spring constant Simulation error (%) | | | | | |
| @ 3.5 ± 0.5 kN *1 | 3.8 | 0.95 | 4.3 | 0.95 | −0.47 |
| @ 8.0 ± 0.5 kN *2 | 4.5 | 5.3 | 2.2 | 1.3 | 3.1 |

*1 actual measurement value = 211 N/mm
*2 actual measurement value = 224 N/mm

Ex.1: Each shell element was provided with integral points (I) whose number was equal to the number of cord and rubber layers as shown in FIG. 2B. The finite element dividing was made as shown in FIG. 6.

Ex.2: Each shell element was provided with integral points (IF) whose number was decreased to two as shown in FIG. 8B. Otherwise the model was the same as Ex.1.

Ex.3: Average stiffness was used in each of the tread area Tr, upper sidewall area Sw and lower sidewall area Bd. Otherwise the model was the same as Ex.2.

Ex.4: The coordinate conversion was omitted using the belt cord angle of 0 degrees, and the carcass cord angle of 90 degrees. Otherwise the model was the same as Ex.3.

Figure 9:
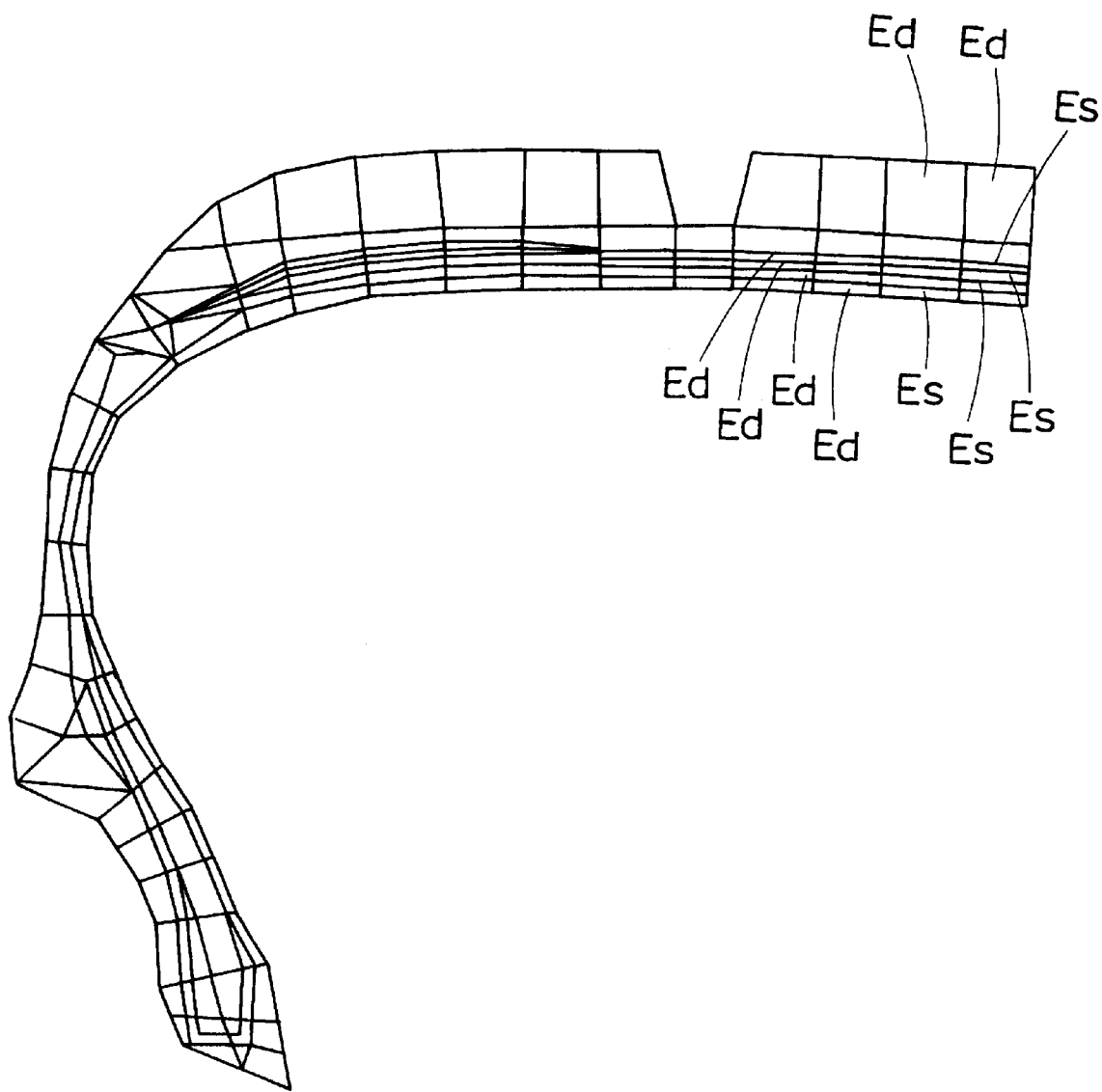
FIG. 9 shows finite element meshes of a tire model according to the prior art.

Ref.: Each rubber layers was modeled by a solid element and each cord layer was modeled by a membrane element as shown in FIG. 2C. The finite element dividing was made as shown in FIG. 9.

Actual tire: The tire was mounted on a wheel rim of size 16×6.5 JJ and inflated to 200 kPa, and the deflection was measured changing the vertical load from 0 to 9 kN. From the load-deflection curve, the actual measurement value was obtained as of the inclination of a segment between 3.0 and 4.0 kN load and a segment between 7.5 and 8.5 kN load.

As shown in Table 1, the computation time can be remarkably decreased while maintaining the accuracy.

Figure 10:
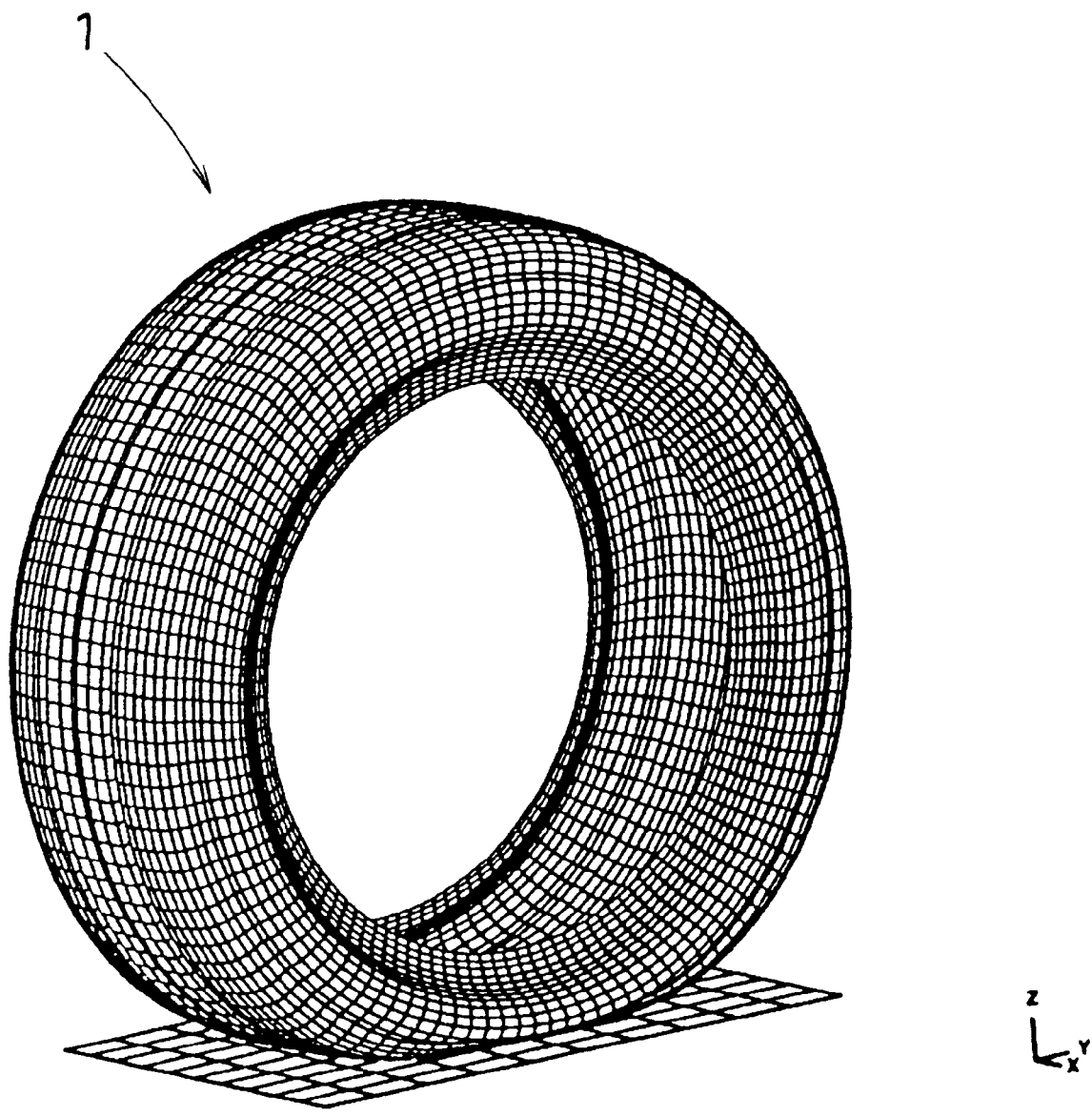
FIG. 10 shows the global image of the finite element tire model.
Figure 11:
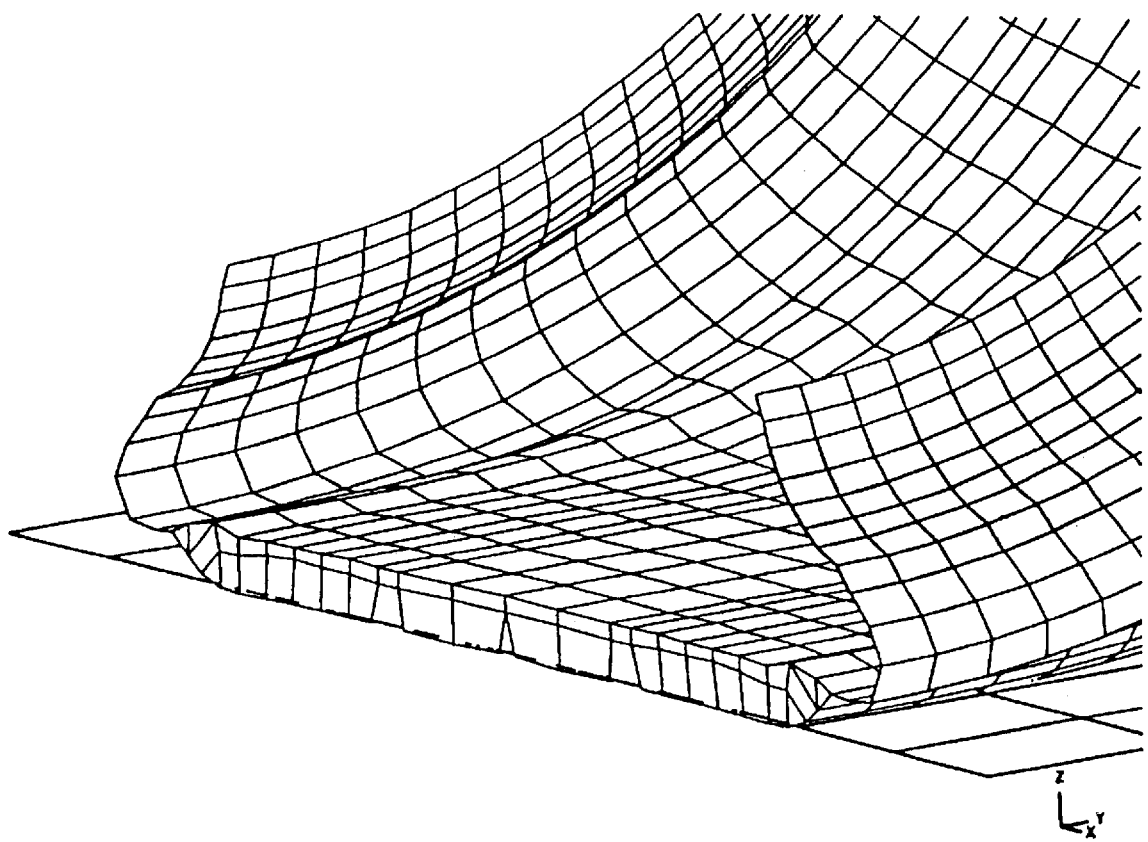
FIG. 11 shows an enlarged image of the finite element tire model which is cut in the middle of the ground contacting patch.
Figure 12:
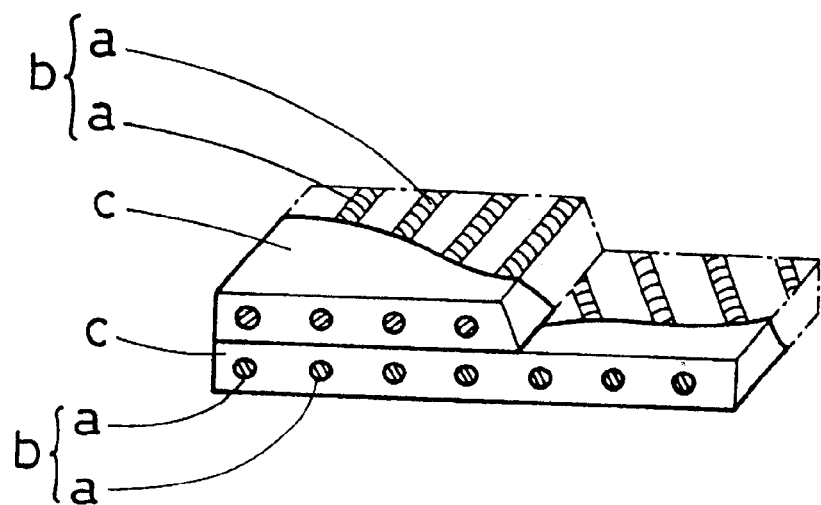
FIG. 12 is a diagram for explaining a method of modeling a cord layer and a rubber layer.
Figure 12:
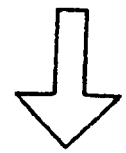
Figure 12:
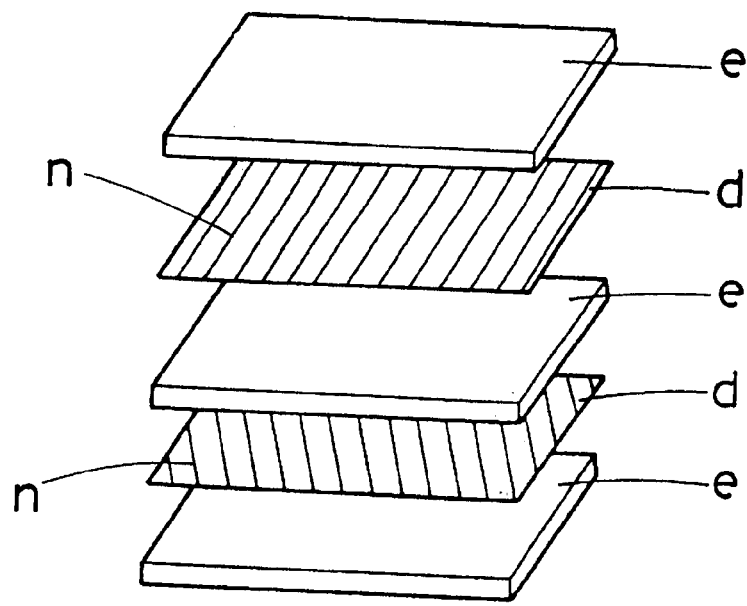

The global image of the finite element tire model during the simulation test is printed out and shown in FIG. 10. An enlarged image of the model cut in the middle of the ground contacting patch along a plane including the tire axis is shown in FIG. 11.

What is claimed is:

1. A method of making a finite element model of a pneumatic tire comprising dividing a pneumatic tire into a plurality of modeling units each of which is to be modeled by one or more finite elements so that said modeling units include modeling units each of which is a layered complex of at least one cord layer and at least one rubber layer, and modeling each said modeling unit which is a layered complex by a single shell element provided with a plurality of integral points corresponding to said at least one cord layer and said at least one rubber layer.

2. The method according to claim 1, which further comprises including at least one integral point per one rubber layer in said a plurality of integral points, and including at least one integral point per one cord layer in said a plurality of integral points.

3. The method according to claim 2, which further comprises
examining whether the total number of said at least one cord layer and said at least one rubber layer in said layered complex is more than two, and
if more than two, decreasing the number of said a plurality of integral points to two per one shell element, providing one on each side of the shell element.

4. The method according to claim 1, which further comprises
providing a succession of shell elements in a certain range along a orthogonal direction to the tire circumferential direction,
obtaining an average of a property such as stiffness in said certain range, and
giving the average property to each of said successional shell elements.

5. The method according to claim 4, wherein
said pneumatic tire comprise a tread reinforcing belt disposed in a tire tread portion and a tread rubber on the radially outside thereof,
said certain range is a tire part between axial edges of the belt excluding said tread rubber, and
said property is stiffness.

6. The method according to claim 4, wherein
said pneumatic tire comprise at least one carcass ply as a cord layer extending between tire bead portions through a tread portion and sidewall portions,
said certain range is a tire part in the sidewall portion including said carcass ply and a sidewall rubber on the axially outside thereof, and
said property is stiffness.

7. The method according to claim 4, wherein
said pneumatic tire comprise at least one carcass ply as a cord layer extending between tire bead portions through a tread portion and sidewall portions and turned up in each bead portion of the tire so that the turned up portion extends into the sidewall portion, and a bead apex rubber as a rubber layer between said turned up portion and the main portion of the carcass ply,
said certain range is a tire part in the sidewall portion including said turned up portion and main portion of the carcass ply and the bead apex rubber and a sidewall rubber as the axially outmost rubber layer, and
said property is stiffness.

8. The method according to claim 1, which further comprises
giving a stiffness anisotropy of said at least one cord layer to said shell element, and
determining said stiffness anisotropy which includes
regarding a carcass as whole as having a cord orientation direction which is orthogonal to the tire circumferential direction, and
regarding a tread reinforcing belt as whole as having a cord orientation direction which is parallel to the tire circumferential direction.

* * * * *